(12) United States Patent
Voshell

(10) Patent No.: US 6,285,215 B1
(45) Date of Patent: Sep. 4, 2001

(54) OUTPUT DRIVER HAVING A PROGRAMMABLE EDGE RATE

(75) Inventor: Tom W. Voshell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/389,662

(22) Filed: Sep. 2, 1999

(51) Int. Cl.$^7$ .................................................. H03K 17/16
(52) U.S. Cl. ............................................. 326/86; 326/83
(58) Field of Search ............................ 326/30, 83, 86, 326/87

(56) References Cited

U.S. PATENT DOCUMENTS

| | | |
|---|---|---|
| 4,829,199 | 5/1989 | Prater . |
| 5,017,807 * | 5/1991 | Kriz et al. ............................ 326/83 |
| 5,134,311 | 7/1992 | Biber et al. . |
| 5,274,276 | 12/1993 | Casper et al. . |
| 5,489,859 * | 2/1996 | Kawaguchi et al. .................. 326/87 |
| 5,581,197 | 12/1996 | Motley et al. . |
| 5,623,216 * | 4/1997 | Penza et al. .......................... 326/83 |
| 5,633,600 * | 5/1997 | Ohnishi ................................ 326/83 |
| 5,644,262 | 7/1997 | Bazes . |
| 5,760,621 | 6/1998 | Keeth . |
| 5,802,009 | 9/1998 | Casper et al. . |
| 5,838,177 * | 11/1998 | Keeth ................................... 326/87 |
| 5,990,701 * | 11/1999 | Starr .................................... 326/30 |

* cited by examiner

Primary Examiner—Michael Tokar
Assistant Examiner—Don Phu Le
(74) Attorney, Agent, or Firm—Thorp Reed & Armstrong, LLP

(57) ABSTRACT

A programmable output driver is comprised of a first signal path for pulling an output node up to a first voltage level and a second signal path for pulling the output node down to a second voltage level. A plurality of capacitors and a plurality of switches are provided for programmably connecting certain of the plurality of capacitors to the second signal path to control the falling edge of a signal output from the driver. In a preferred embodiment, the first signal path includes a boot circuit which primarily controls the leading edge of the signal output from the driver. A method of operating an output driver is also disclosed.

26 Claims, 4 Drawing Sheets

OUTPUT DRIVER HAVING A PROGRAMMABLE EDGE RATE

BACKGROUND OF THE INVENTION

1. Field of the Invention

The present invention is directed generally to output circuits and, more particularly, to output drivers having the ability to control the rise and fall times of the signals output therefrom.

2. Description of the Background

Drive circuits, or drivers as they are commonly called, are used in a variety of applications. Typically, the driver acts as an interface between a logic circuit, or other circuitry where signals are being manipulated at very low levels and circuits or loads which require high signal levels or large current levels. For example, drivers are found in various types of memory devices as the interface between data pads and the internals of the memory device. In such an environment, the driver is typically used to drive the data pad to a first voltage to represent a logic level 1 and a second voltage to represent a logic level 0. The driver typically must source sufficient current to enable signals available at the data pads to travel significant lengths along buses or to be sensed by other types of loads.

Prior art drive circuits typically utilize a pair of output drive transistors designed to operate in a complementary fashion. For example, the data pad may be connected to the first voltage through an N-type transistor and connected to the second voltage through a P-type transistor. When one of the transistors is on, the other transistor is off. In modern circuits, both transistors may be off to allow the data pad to receive data.

When designing drivers, it is necessary to insure that the transistors turn off as quickly as possible so that the situation does not exist wherein both transistors are on. Additionally, because of the high operating speeds of integrated circuits, it is necessary for the transistors to rapidly change state. It is also desirable to produce a driver which provides an output signal that is substantially symmetrical with respect to its leading edge and falling edge. However, due to process variations, the signal path servicing the N-type transistor may differ from the signal path servicing the P-type transistor such that the resulting output signal is not symmetric. Additionally, timing specifications for various applications may require adjustment of the leading or falling edge of the output signal. Accordingly, the need exists for a driver capable of compensating for process variations and for providing flexibility with respect to the timing of the output signal produced by the driver.

SUMMARY OF THE PRESENT INVENTION

The present invention is directed to a programmable output driver comprising a first signal path for pulling an output node up to a first voltage level and a second signal path for pulling the output node down to a second voltage level. A plurality of capacitors and a plurality of switches are provided for programmably connecting certain of the plurality of capacitors to the second signal path to control the falling edge of a signal output from the driver. In a preferred embodiment, the first signal path includes a boot circuit which primarily controls the leading edge of the signal output from the driver.

The present invention is also directed to a method of operating an output driver comprising driving an output node of the driver to a first voltage level in response to the driver receiving a first input signal at a first signal path and driving the voltage available at the output node of the driver to a second voltage level in response to the driver receiving a second input signal at a second signal path. The capacitive load of the second path is programmably controlled to control the rate of change at the output node from the first voltage level to the second voltage level.

Because the apparatus and method of the present invention provide the ability to control the capacitive load presented by the second signal path, the capacitive load of the second signal path may be balanced with the capacitive load of the first signal path so that the rise and fall times of a signal output from the drive circuit are equal. However, because the falling edge of the signal output from the driver can be controlled, the overall timing of the output signal can be controlled so that different timing specifications can be met. The ability to programmably control at least one of the edges of the output signal also provides the ability to compensate for process variations. Those advantages and benefits, and others, will be apparent from the Description of the Preferred Embodiment hereinbelow.

BRIEF DESCRIPTION OF THE DRAWINGS

For the present invention to be easily understood and readily practiced the invention will now be described, for the purposes of illustration and not limitation, in conjunction with the following figures wherein.

DESCRIPTION OF THE PREFERRED EMBODIMENT

Figure 1:
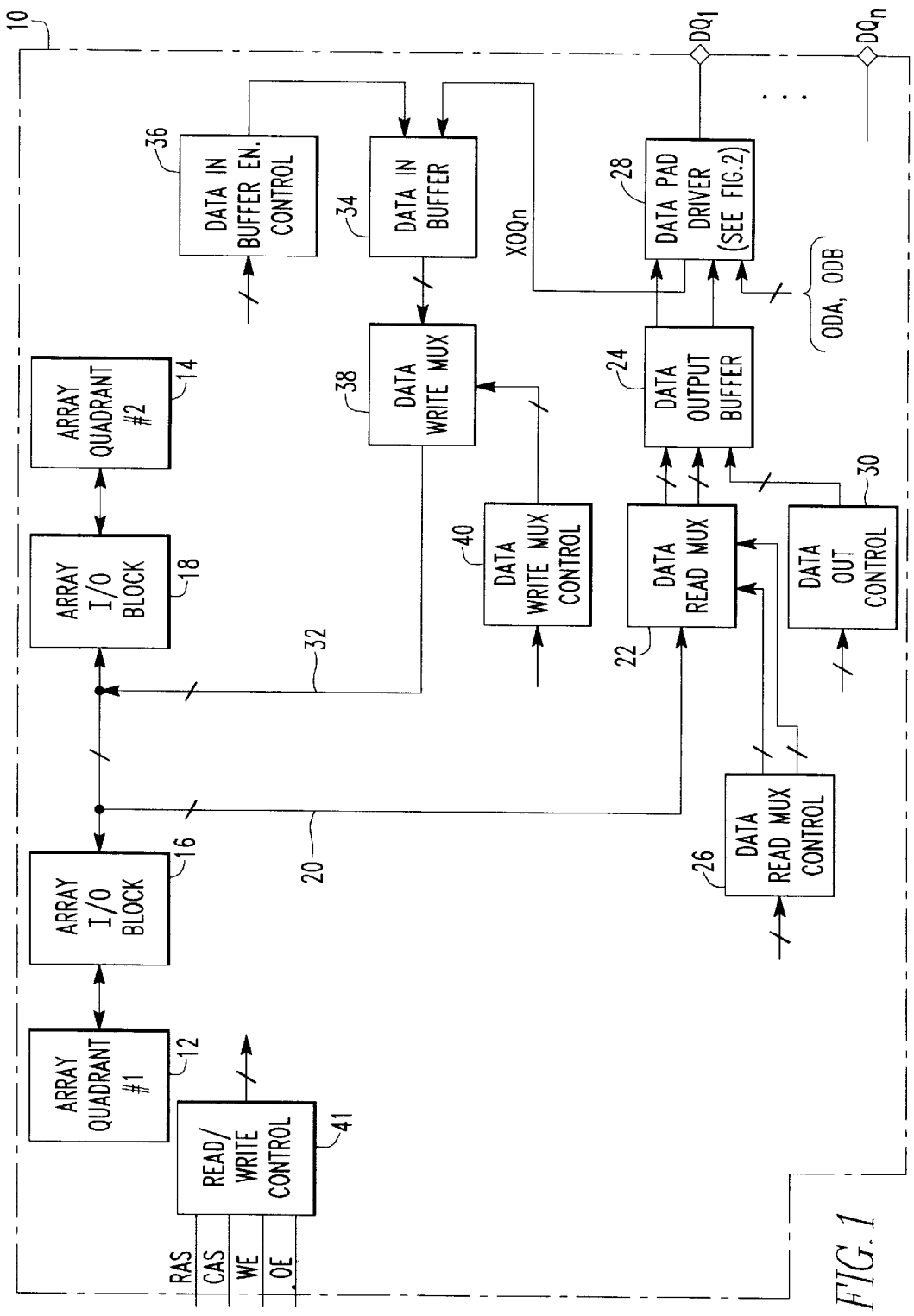
FIG. 1 is a block diagram of a memory circuit in which the driver of the present invention may be employed.

FIG. 1 illustrates a memory device 10 with which the drive circuit, or driver, of the present invention may be used. The reader should recognize that the driver of the present invention may be used in a number of devices other than the memory device 10 illustrated in FIG. 1. The memory device 10 illustrated in FIG. 1 is thus presented for purposes of illustration to provide a concrete example of where the driver of the present invention may be utilized. The reader should also recognize that the memory circuit 10 illustrated in FIG. 1 has been greatly simplified. Those of ordinary skill in the art will recognize that a number of other components are necessary to produce an operative memory device 10. However, as such other components serve no purpose with respect to the understanding of the present invention, such components have been eliminated for purposes of clarity.

In the memory device 10 of FIG. 1, a plurality of individual memory cells are arranged in an array which is divided into a first array quadrant 12 and a second array quadrant 14. Array quadrant 12 is serviced by an array I/O block 16 while array quadrant 14 is serviced by an array I/O block 18. The array I/O blocks 16 and 18 place data read from the memory array on a data read path 20. The first element of the data read path 20 is a data read mux 22. The data read mux 22 determines the data to be input to an output data buffer 24 in response to control signals produced by a data read mux control circuit 26. The data output buffer 24 outputs the data to a data pad driver 28 in response to a data out control circuit 30. The data pad driver 28 drives a data pad DQ1 to either a first or a second voltage, e.g. Vccq or Vssq, to represent a logic level "1" or a logic level "0", respectively, on the pad DQ1. Data pad driver 28 also receives control signals ODA and ODB as will be described hereinbelow. The reader will recognize that a typical memory device 10 will have a plurality of data pad drivers 28 servicing data pads DQ1 through DQn. The data pad driver 28 forms an important part of the present invention and will be described in greater detail hereinbelow in conjunction with FIG. 2.

Completing the description of the memory device 10 illustrated in FIG. 1, a write data path 32 is provided. The write data path 32 includes a data in buffer 34 which is under the to control of a data in buffer control circuit 36. Data from the data in buffer 34 is input to a data write mux 38 which is under the control of a data write mux control circuit 40. From the data write mux 38, data is input to the array I/O blocks 16, 18 and ultimately written into array quadrants 12, 14, respectively, according to address information received by memory device 10. A read/write control circuit 41 is responsive to control signals such as, for example, RAS, CAS, WE, and OE, to produce the various signals needed for proper operation of the data read mux control 26, data out control 30, data in buffer enable control 36, and data write mux control 40. The array I/O blocks 16, 18 together with the data read path 20, write data path 32, and read/write control 41 comprise peripheral circuits for moving information between the array quadrants 12, 14 and the data pads DQ1–DQn.

Figure 2:
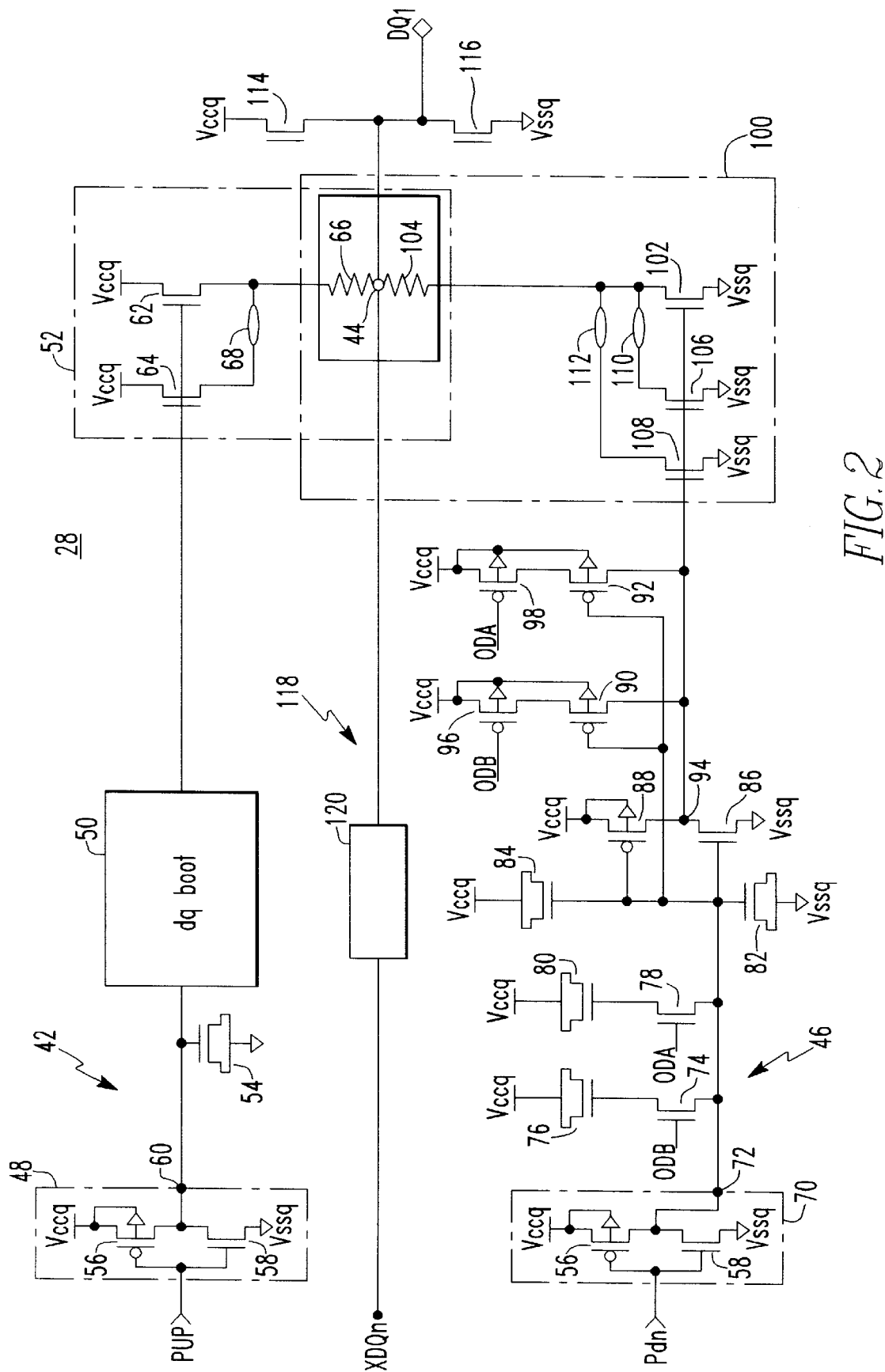
FIG. 2 is a schematic of a drive circuit constructed according to the teachings of the present invention.

Turning to FIG. 2, the driver 28 is comprised of a first signal path 42 servicing an output node 44. The driver 28 has a second signal path 46 which also services the output node 44. Thus, the output node 44 is common to both the first signal path 42 and the second signal path 46.

The first signal path 42 is comprised of an input stage 48, a dq boot circuit 50 and an output stage 52. The first signal path 42 has associated with it a fixed capacitance. To provide that fix capacitance, a capacitor 54 is connected to the first signal path 42 between the input stage 48 and the dq boot circuit 50.

The input stage 48 is comprised of a pair of transistors 56, 58. The transistor 56 may be a P-type transistor, having its control terminal responsive to a first input signal Pup while the transistor 58 may be a N-type transistor having a control terminal also responsive to the first input signal Pup. The remaining two terminals of the transistor 56 are connected across Vccq and a common node 60 while the remaining two terminals of the transistor 58 are connected across the common node 60 and a voltage source Vssq.

Figure 3:
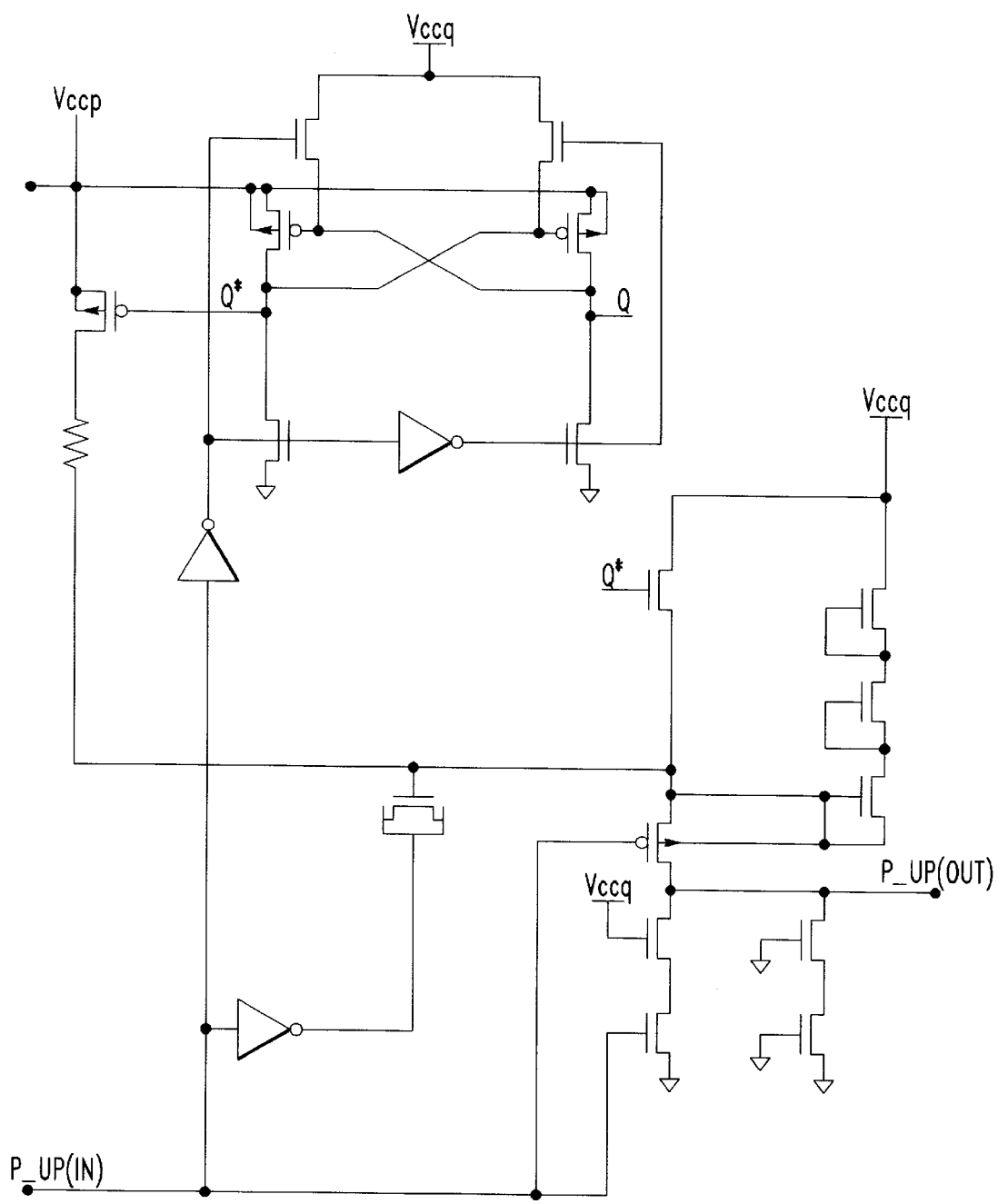
FIG. 3 is a schematic of the boot circuit shown in FIG. 2.

The dq boot circuit 50 may take the form of any conventionally known boot circuit. An example of one such boot circuit is shown in FIG. 3. However, as the boot circuit 50 does not form an important feature of the present invention, no further explanation of that circuit is provided.

The output stage 52 may be comprised of 2 N-type transistors 62 and 64. The transistor 62 has a control terminal responsive to the dq boot circuit 50. The other two terminals of the transistor 62 are connected between the voltage source Vccq and the output node 44 through a resistor 66. The control terminal of the transistor 64 is also responsive to the dq boot circuit 50. The other two terminals of the transistor 64 are connected between Vccq and the output node 44 through the resistor 66 and a programmable device 68. The transistor 64 is provided so that additional current may be provided to node 44 when transistor 64 is conductive. In the event that the current provided by transistor 64 is not required, the programmable device 68 may be opened thereby removing transistor 64 from the circuit. Alternatively, programmable device 68 may be a device which is normally open, such that it is closed to enable transistor 64 to be added to the circuit. In any event, the number of transistors 62, 64 used in output stage 52 is not material to the present invention.

The second signal path 46 is comprised of an input stage 70 which is constructed in the same manner as input stage 48 with two exceptions. First, the input stage 70 is responsive to a second input signal Pdn. Second, the transistors 56 and 58 are connected between Vccq and a common node 72, and the common node 72 and Vssq, respectively. The common node 72 is connected to Vccq and Vssq through a plurality of devices which will now be described.

Node 72 is connected to Vccq through a transistor 74 connected in series with a capacitor 76 and another transistor 78 connected in a series with a capacitor 80. The transistor 74 is responsive to a control signal ODB while the transistor 78 is responsive to a control signal ODA. Thus, the transistors 74 and 78 act as switches to either add the capacitance represented by capacitors 76 and 80 to the second signal path 46 or remove the capacitance represented by capacitors 76 and 80 from the second signal path 46, depending upon the state of control signals ODB and ODA, respectively.

The node 72 is connected to Vssq through a capacitor 82 and to Vccq through a capacitor 84. The common node 72 is also connected to the control terminal of a transistor 86, the control terminal of a P-type transistor 88, the control terminal of a P-type transistor 90, and the control terminal of P-type transistor 92. The other two terminals of transistor 86 are connected across a node 94 and Vssq. The other two terminals of transistor 88 are connected across Vccq and node 94. The other two terminals of transistor 90 are connected to node 94 and, through a switching transistor 96, to Vccq. Similarly, the other two terminals of transistor 92 are connected to node 94 and, through a switching transistor 98 to Vccq. Switching transistor 96 is responsive to the signal ODB while switching transistor 98 is responsive to the signal ODA.

The second signal path 46 has an output stage 100. The output stage 100 is comprised of an output transistor 102 responsive to the second input signal Pdn which is input to its control terminal. The other two terminals of the transistor 102 are connected between the common node 44 through a resistor 104 and Vssq. Two other output transistors 106, 108 may each be connected in parallel with output transistor 102 through the operation of programmable devices 110, 112, respectively.

The common node 44 is connected to the data pad DQ1. The common node 44 is also connected to Vccq through a device 114 and to Vssq through a device 116.

The driver 28 is a tri-state device meaning that the first signal path 42 and the second signal path 46 may essentially be shut off so that data may be received at data pad DQ1. When data is received at data pad DQ1, it is conducted along a third signal path 118 through a resistance 120 to an output terminal of the driver 28 labeled XDQn.

Figure 4:
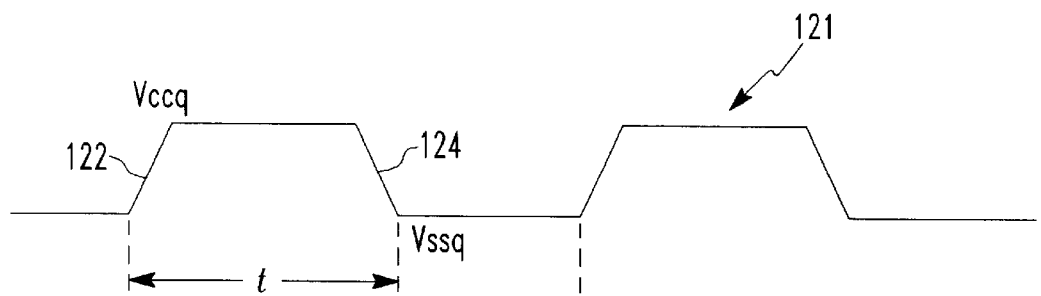
FIG. 4 is a timing diagram of a signal output from the drive circuit of FIG. 2.

The operation of the driver 28 may be best understood with reference to FIG. 4. In FIG. 4, an output signal 121 which may be available on pad DQ1 is illustrated. The N-type transistors of the output stage 52 and the P-type transistors of the output stage 100 are operated in a manner so that the voltage available at the pad DQ1 is driven either to Vccq when the transistors 62 and/or 64 are on, or driven to Vssq when the transistors 102 and/or 106, 108 are on. The transition between voltages creates a leading edge 122 and a falling edge 124 for the signal 121.

The leading edge 122 is determined primarily by the characteristics of the dq boot circuit 50. The boot circuit 50 determines how quickly the transistor 62 may be turned fully on. The characteristics of boot circuits 52 are well known and well documented. Thus, the design engineer has a fairly good idea of what the leading edge 122 of the output signal 121 will look like.

As a result of process variations, the time t in FIG. 4 may vary. Additionally, the time may need to be varied to meet various timing specifications. To provide flexibility to compensate for process variations, or to meet various timing diagrams, the falling edge 124 of the signal 121 may be controlled through use of the second signal path 46.

The speed of operation of the transistor 102 may be controlled by controlling the value of the capacitance available at node 72. Generally, the transistor 102 should be shut off quickly to prohibit current flow from node 44 when the transistor 62 is conductive. Conversely, when the transistor 62 is non-conductive, the transistor 102 should be rendered conductive in a controlled manner. A large value of capacitance at node 72 together with a large transistor for transistor 86 combine to turn off transistor 102 quickly. The charge on capacitors 82 and 84 is controlled by transistors 56 and 58. When capacitor 82 is charged, the voltage at node 72 is high, and the capacitance of the P-type devices 96 and 98, if connected to the node 72, is low. When the capacitor 82 is discharged, the voltage at node 72 is low and the capacitance of the p-type devices, if connected to the signal path 46 is high.

Connection of the capacitance of devices 96 and 98, as well as the capacitors 76 and 80, is controlled by the signals ODB and ODA, respectively. When ODB is high, switching transistor 74 is conductive while the transistor 96 is non-conductive. Similarly, when the signal ODA is high, the switching transistor 78 is conductive while the transistor 98 is non-conductive. By controlling the state of the switching transistor 74 with the signal ODB and controlling the state of the switching transistor 78 with the signal ODA, the amount of capacitance, and hence the voltage available at node 72 for driving transistor 86 can be controlled.

Figure 5:
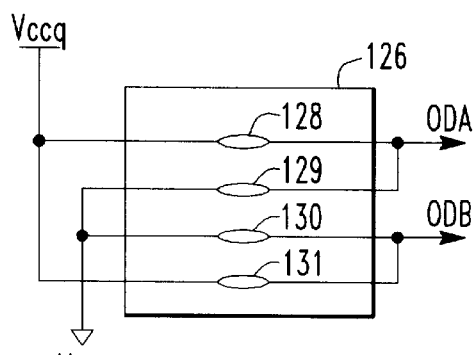
FIG. 5 illustrates one mechanism for programmably controlling the falling edge of the output signal shown in FIG. 4.

In FIG. 5, a fuse block 126 is illustrated. The fuse block is comprised of four fusible links, 128, 129, 130, and 131 which, through the application of appropriate process steps, can be rendered conductive. Through proper selection of which fusible links 128 through 131 are rendered conductive, the state of the control signals ODA and ODB can be programmed. Another type of mechanism for controlling signals ODA and ODB, and hence the falling edge 124 of signal 121, is to provide fuses which are closed and rendered open through the application of appropriate process steps. Although it is anticipated that the state of the signals ODA and ODB will be determined and set at the place of manufacture, such determination may be done at the point where the circuits employing the driver 28 are used or dynamically under the control of a microprocessor (not shown).

The apparatus of the present invention thus provides a method of controlling the edge rate of the drive circuit 28. By determining the capacitive load of the first signal path 42, the capacitive load of the second signal path 46 can be adjusted such that a predetermined relationship exists between the capacitive loads of each signal path. Under certain conditions, it may be desirable for the capacitive loads to be substantially identical such that the leading edge 122 and falling edge 124 are substantially the same. By operating the circuit 28 and driving the voltage at the data pad DQ1 up to Vccq and down to Vssq, the amount of capacitance in the first path can be determined, and the amount of capacitance in the second path can be programmably controlled to achieve the desired characteristics. The programmability of the present invention provides the ability to compensate for process variations and also provides the ability to meet various differing output timing specifications.

Figure 6:
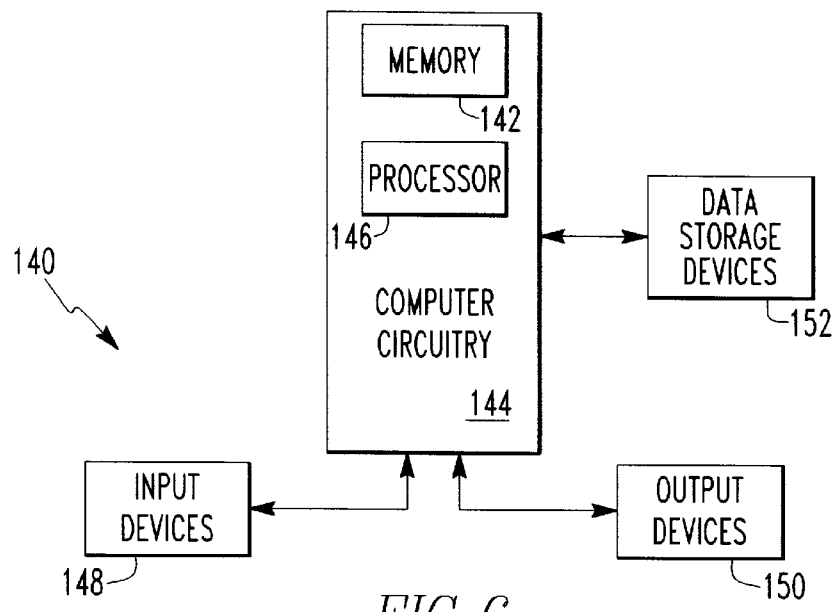
FIG. 6 is a block diagram of a system in which the drive circuit of the present invention may be employed.

FIG. 6 is a block diagram of an electronic system 140, such as a computer system, that incorporates a memory device 142 of a type which may include the driver 28 of the present invention. The system 140 includes computer circuitry 144 for performing computer functions, such as executing software to perform desired calculations and tasks. The circuitry 144 typically includes a processor 146 and the memory device 142, which is coupled to the processor 146. One or more input devices 148, such as a keyboard or mouse, are coupled to the computer circuitry 144 and allow an operator (not shown) to manually input data thereto. One or more output devices 150 are coupled to the computer circuitry 144 to provide to the operator data generated by the computer circuitry 144. Examples of such output devices 150 include a printer and a video display unit. One or more data-storage devices 152 are coupled to the computer circuitry 144 to store data on or retrieve data from external storage media (not shown). Examples of the storage devices 152 and the corresponding storage media include drives that accept hard and floppy disks, tape cassettes, and compact disk read-only memories (CD-ROMs). Typically, a computer circuitry 144 includes address, data, and command buses and a clock line that are respectively coupled to the address, data and command buses and the Clk line of the memory device 142.

While the present invention has been described in conjunction with preferred embodiments thereof, those of ordinary skill in the art will recognize that many modifications and variations are possible. In particular the driver of the present invention may be used in other types of memory devices as well as other types of circuits. The leading edge can be controlled instead of the falling edge, or both edges may be controlled. The present invention is not limited by the configuration of the input stages 48, 70 or the configuration of the output stages 52, 100. The description appearing hereinabove and the following claims are intended to cover all such modifications and variations.

What is claimed is:

1. A method of controlling the edge rate of a drive circuit having two electrical paths servicing a common node, comprising:

determining the capacitive load of a first path; and adjusting the capacitive load of a second path using programmable devices such that a predetermined relationship exists between the capacitive loads of each path.

2. The method of claim 1 additionally comprising the step of adding a fixed capacitive load to the capacitive load of the first path.

3. The method of claim 1 wherein said adjusting step includes adjusting the capacitive load of the second path such that it is substantially equal to the capacitive load of the first path.

4. The method of claim 1 wherein said step of adjusting includes the steps of adding capacitance to or subtracting capacitance from the capacitive load of the second path.

5. A system, comprising:
a microprocessor; and
a memory device connected to said microprocessor, said memory device comprising:
an array of memory cells;
a plurality of data pads; and
peripheral circuitry for moving information between said array of memory cells and said plurality of data pads, said circuitry including a plurality of drivers each servicing one of said data pads, each driver comprising:
a first signal path connected to one of said data pads and having a fixed capacitance associated therewith;
a second signal path connected to said data pad;
a plurality of capacitors; and
a plurality of switches connected between said second signal path and said plurality of capacitors.

6. A method of controlling the load capacitance in first and second paths of a drive circuit providing an output signal at an output node, comprising:
adding a fixed amount of capacitance to a first path;
changing the amount of capacitance of a second path by switching capacitance into or switching capacitance out of the second path by turning transistors on and off such with programmable devices that a predetermined relationship exists between the capacitance of the first path and the capacitance of the second path.

7. The method of claim 6 wherein said step of changing includes changing the capacitive load of the second path such that it is substantially equal to the capacitive load of the first path.

8. An output driver, comprising:
an output node;
a first signal path connected to said output node and having a fixed capacitance associated therewith;
a second signal path connected to said output node;
a plurality of capacitors; and
a plurality of switches connected between said second signal path and said plurality of capacitors.

9. The driver of claim 8 wherein said plurality of switches includes a plurality of transistors.

10. The driver of claim 8 wherein said first signal path comprises an input stage, a boot circuit, and an output stage connected to said output node, and wherein said fixed capacitance is connected between said input stage and said boot circuit.

11. The driver of claim 8 wherein said second signal path comprises an input stage and an output stage connected to said output node, and wherein said plurality of switches is connected between said input and said output stages.

12. A method of operating an output driver, comprising:
driving an output node of the driver to a first voltage level in response to the driver receiving a first input signal at a first signal path;
driving the voltage available at the output node of the driver to a second voltage level in response to the driver receiving a second input signal at a second signal path;
adjusting the capacitive load of the second path to control the rate of change at the output node from the first voltage level to the second voltage level by controlling the state of a transistor with a programmable device.

13. The method of claim 12 wherein said adjusting step includes the step of removing capacitance from the second signal path.

14. The method of claim 12 wherein said adjusting step includes the step of adding capacitance to the second signal path.

15. A method of controlling an output driver having a first signal path for pulling an output node up to a first voltage level and a second signal path for pulling the output node down to a second voltage level, comprising:
adding a fixed amount of capacitance to the first signal path;
determining the capacitive load of the first signal path;
adjusting the capacitive load of the second signal path such that the capacitive load of the second signal path is substantially equal to the capacitive load of the first signal path.

16. The method of claim 15 wherein said step of adjusting includes the step of adding capacitance to the second signal path.

17. The method of claim 15 wherein said step of adjusting includes the step of removing capacitance from the second signal path.

18. A programmable output driver, comprising:
a first signal path for driving an output node to a first voltage level;
a second signal path for driving the output node to a second voltage level;
a plurality of capacitors; and
a plurality of switches for connecting said plurality of capacitors to said second signal path.

19. The driver of claim 18 wherein said first signal path comprises an input stage, a boot circuit, and an output stage connected to the output node, said driver additionally comprising a fixed capacitance added between said input stage and said boot circuit.

20. The driver of claim 18 wherein said second signal path comprises an input stage and an output stage connected to the output node, and wherein said plurality of switches is connected between said input and said output stages.

21. The driver of claim 18 wherein said plurality of switches includes a plurality of transistors, said transistors being responsive to programmable devices.

22. A memory device, comprising;
an array of memory cells;
a plurality of data pads; and
peripheral circuitry for moving information between said array of memory cells and said plurality of data pads, said circuitry including a plurality of drivers each servicing one of said data pads, each driver comprising:
a first signal path connected to one of said data pads and having a fixed capacitance associated therewith;
a second signal path connected to said data pad;
a plurality of capacitors; and
a plurality of switches connected between said second signal path and said plurality of capacitors.

23. The memory device of claim 22 wherein said plurality of switches includes a plurality of transistors.

24. The memory device of claim 22 wherein said first signal path comprises an input stage, a boot circuit, and an output stage connected to said data pad, and wherein said fixed capacitance is connected between said input stage and said boot circuit.

25. The memory device of claim 22 wherein said second signal path comprises an input stage and an output stage connected to said data pad, and wherein said plurality of switches is connected between said input and said output stages.

26. The memory device of claim 22 wherein each of said drivers additionally comprises a third signal path connected to said data pad, said third signal path for receiving information input to said data pad.

* * * * *

UNITED STATES PATENT AND TRADEMARK OFFICE
CERTIFICATE OF CORRECTION

PATENT NO. : 6,285,215 B1
DATED : September 4, 2001
INVENTOR(S) : Voshell

It is certified that error appears in the above-identified patent and that said Letters Patent is hereby corrected as shown below:

Column 1,
Line 58, in the section entitled "Summary of the Present Invention," delete the word "arc" and insert the word -- are --.

Column 3,
Line 19, delete the word "to".

Signed and Sealed this

Nineteenth Day of March, 2002

Attest:

*Attesting Officer*

JAMES E. ROGAN
*Director of the United States Patent and Trademark Office*